United States Patent [19]

Himeno et al.

[11] Patent Number: 5,134,252
[45] Date of Patent: Jul. 28, 1992

[54] SIGNAL LINE

[75] Inventors: Takuji Himeno; Takashi Sato, both of Tokyo, Japan

[73] Assignee: Sony Corporation, Tokyo, Japan

[21] Appl. No.: 642,918

[22] Filed: Jan. 18, 1991

[30] Foreign Application Priority Data

Jan. 21, 1990 [JP] Japan .................................. 2-004095

[51] Int. Cl.[5] .......................... H05K 1/00; H05K 3/00; G11B 21/18
[52] U.S. Cl. ..................................... 174/268; 29/829; 29/830; 174/36; 174/117 FF; 174/254; 360/107; 361/398; 439/497; 439/502
[58] Field of Search ................... 174/36, 117 FF, 254, 174/268; 439/492, 497, 502; 361/398; 360/107, 108; 29/829, 830, 831

[56] References Cited

U.S. PATENT DOCUMENTS

| | | | |
|---|---|---|---|
| 3,462,542 | 8/1969 | Richter | 439/497 X |
| 3,818,122 | 6/1974 | Luetzow | 174/117 FF X |
| 3,876,964 | 4/1975 | Balaster et al. | 174/268 |
| 4,265,549 | 5/1981 | Cote | 361/398 X |
| 4,476,404 | 10/1984 | Bygdnes | 439/502 X |
| 4,544,973 | 10/1985 | Van De Bult | 360/106 |
| 4,654,738 | 3/1987 | Kato et al. | 360/108 |
| 4,845,315 | 7/1989 | Stopper | 174/117 FF X |
| 4,885,430 | 12/1989 | Kinser, Jr. et al. | 174/254 |
| 4,923,406 | 5/1990 | Bucknam | 361/398 X |

Primary Examiner—Morris H. Nimmo

[57] ABSTRACT

Shielding portions are superposed on opposite sides of an elongated flexible circuit board on which signal wires are formed to provide a flexible shielded signal wire. The flexible shielded signal wire is especially adapted to transmit signals to and from a rotary head drum of a digital audio tape recorder.

8 Claims, 2 Drawing Sheets

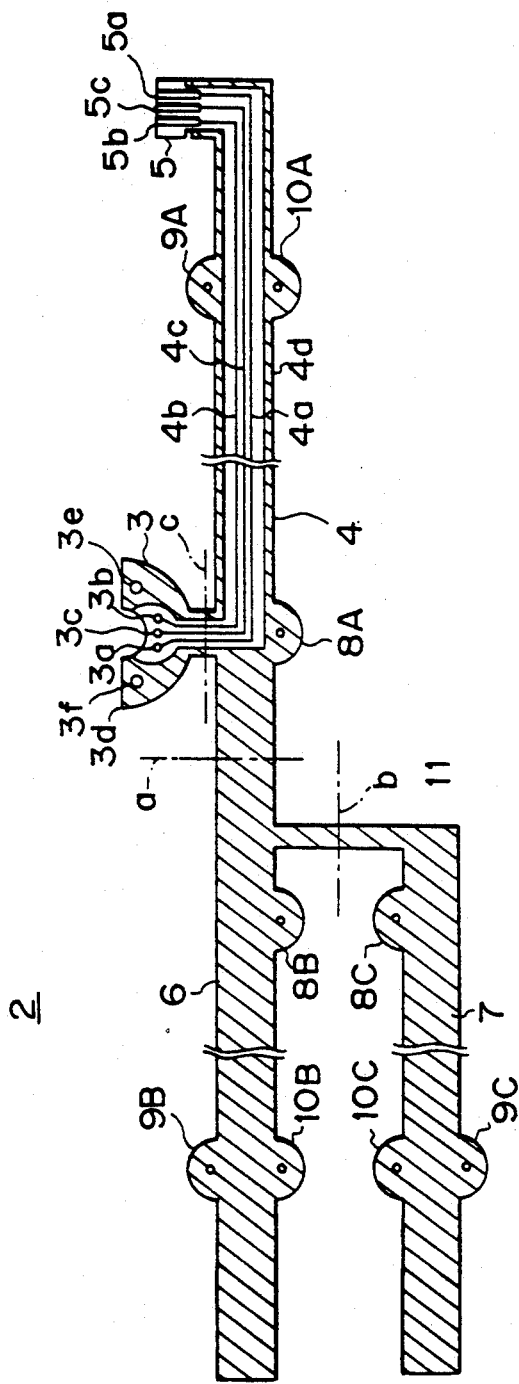

SIGNAL LINE

BACKGROUND OF THE INVENTION

1. Field of the Invention

The present invention relates to a shielded signal wire, for example a shielded signal wire that transmits a head output signal reproduced from a recording medium by a rotary head of a rotary head type digital audio tape recorder (DAT) or that transmits a recording signal to the rotary head.

2. Description of the Prior Art

In a conventional rotary head type tape recorder, head output signals obtained from the rotary head are of very low amplitude, and hence the wire by means of which they are conducted to a circuit board having the necessary signal processing unit arranged on it must be shielded. The shielding prevents noise from the surroundings from infiltrating the signals and degrading them.

However, such a shielded wire, which includes a mesh wire for shielding arranged around the signal wire, is quite thick. Hence there is a significant spatial problem particularly when the tape recorder is to be reduced in size.

Moreover, soldering is required in order to connect the shielded wire to the rotary head and the circuit board, and this increases the number of production steps. In addition, reliability deteriorates because in a certain percentage of cases the soldering may be imperfect.

The rotary heads normally have two channels, channel A and channel B, and when multicore shielded wire is used for conducting the signals of the two channels, the shield wire becomes stiff. Thus, in a tape recorder in which the drum on which the rotary head is mounted is movable in accordance with its mode of operation, there is the problem that the load on the actuator for controlling movement of the drum increases. An actuator of substantial size and power is required, which further militates against miniaturization.

OBJECTS AND SUMMARY OF THE INVENTION

In view of the foregoing, an object of this invention is to solve the problems of the prior art outlined above. In particular, an object of the invention is to provide a shielded signal wire which is capable of solving the problems of conventional devices by the use of a flexible circuit board having three parts that cooperate by virtue of a folding process.

The foregoing and other objects of the invention are achieved in accordance with a first aspect of the invention by the provision of a shielded signal wire in the form of flexible printed board means, the flexible printed board means comprising: first and second shielding portions in the shape of a strip and having a predetermined shield pattern; first and second spaced-apart connector portions; and a signal line pattern portion in the shape of a strip and having a conductive pattern that forms a predetermined signal line connecting the first and second connector portions; the first and second shielding portions being folded in a predetermined manner, thereby to superpose the signal line between the first and second shielding portions.

In accordance with another aspect of the invention, there is provided a method of manufacturing a shielded signal wire comprising the steps of: forming a substantially flexible circuit board having a substantially flat signal wire portion on which signal wires are provided and first and second substantially flat shielding portions; folding the first shielding portion over one side of the signal wire portion; and folding the second shielding portion over an opposite side of the signal wire portion; thereby substantially enclosing the signal wire portion within the first and second shielding portions.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawing:

FIG. 2 is a diagrammatic plan view illustrating the shielded signal wire of FIG. 1 prior to folding about fold lines a and b;

FIG. 3 is a diagrammatic sectional view taken along the lines III—III of FIG. 1 and showing the shielded signal wire in cross section; and FIG. 4 is a diagrammatic view illustrating deformation of the shielded signal wire in response to movement of a head drum of the apparatus of FIG. 1.

DESCRIPTION OF THE PREFERRED EMBODIMENTS

Figure 1:
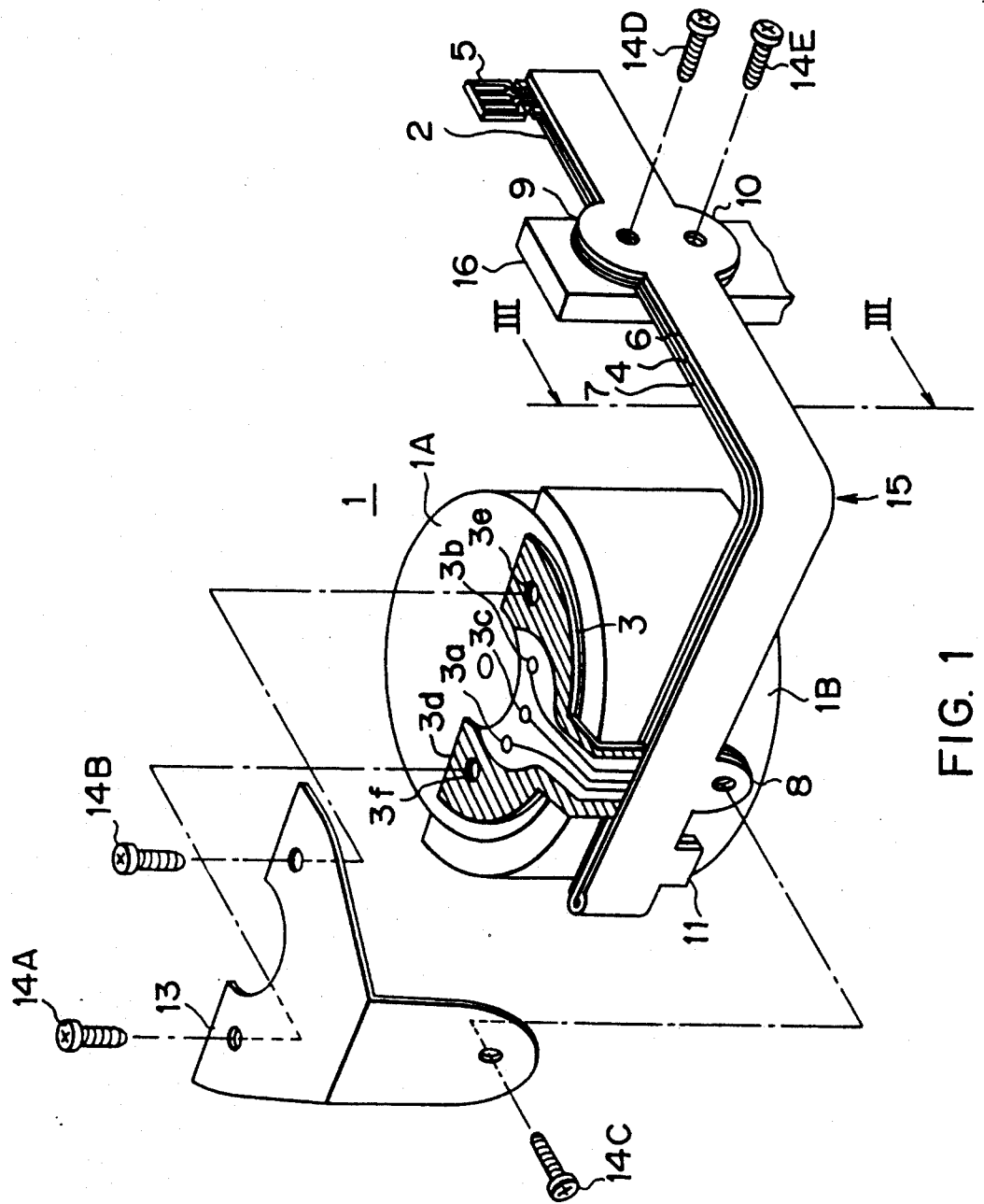
FIG. 1 is a diagrammttic perspective view showing a preferred embodiment of a tape recorder using a shielded signal wire according to the present invention.

Preferred embodiments of this invention will be described with reference to the accompanying drawings.

In FIG. 1, numeral 1 generally designates a drum on which a rotary head of a rotary head type tape recorder is mounted. In this embodiment, channel A and channel B signals which are received from the rotary head within the drum 1 are supplied to a separate circuit board (not shown) together with a ground signal through a shielded signal wire 2.

In practice, the shielded signal wire 2 as a whole is formed by punching out a single flexible circuit board and has a shape before folding as shown in FIG. 2. The shielded signal wire 2 is provided with a drum mounting portion 3, a signal wire pattern portion 4, a connector portion 5, and first and second shielding portions 6 and 7.

The drum mounting portion 3 is semicircular and provided at its central portion with signal wire terminals 3a, 3b and 3c which are connectable to channel A and B signal terminals and a ground signal terminal on the upper end surface 1A of the drum 1. The drum mounting portion 3 further has a shielding pattern 3d formed around it, and the shielding pattern 3d is provided at predetermined positions with fastening holes 3e and 3f.

The signal wire pattern portion 4 which is connected to the drum mounting portion 3 is in the shape of a strip and is provided with signal patterns 4a and 4b for channel A and B signals, respectively. The signal patterns 4a and 4b are respectively connected to the signal wire terminals 3a and 3b of the drum mounting portion 3. Between the signal patterns 4a and 4b there is formed a signal pattern 4c for ground signals. The signal pattern 4c is connected to the terminal 3c. Along the signal patterns 4a, 4b and 4c there is provided a shielding pattern 4d.

Opposite the drum mounting portion 3 of the signal wire pattern portion 4 and on opposite sides of an intermediate portion of the signal wire pattern portion 4 there are respectively formed first, second and third fastening hole pattern portions 8A, 9A and 10A. The portions 8A, 9A and 10A are semicircular shielding patterns, and each has a through-hole at a central portion thereof.

The first shielding portion 6 is formed near one end of the signal wire pattern portion 4 (FIG. 2) and is in the shape of a strip substantially symmetrical to the signal wire pattern portion 4 about a first fold line a.

Also, the first shielding portion 6 has first, second and third fastening hole pattern portions 8B, 9B and 10B respectively corresponding to the fastening hole pattern portions 8A, 9A and 10A in the signal wire pattern portion 4.

The second shielding portion 7 extends from a predetermined position of the first shielding portion 6 on the side of the fold line a (FIG. 2) opposite the signal wire pattern portion 4. The second shielding portion 7 has a shielding pattern in the shape of a strip substantially symmetrical to the first shielding portion 6 about a second fold line b. An elongated connection portion 11 is perpendicular to the shielding portions 6 and 7 and is bisected by the fold line b, which extends parallel to the shielding portions 6 and 7 and perpendicular to the fold line a. Alternatively, the shielding portions 6 and 7 may extend from opposite edges of the wire pattern portion 4 and the fold lines a and b may be parallel to each other. Other relative arrangements of the fold lines a and b will readily occur to those skilled in the art.

The second shielding portion 7 is provided with first, second and third fastening hole pattern portions 8C, 9C and 10C corresponding respectively to the fastening hole pattern portions 8A, 9A and 10A in the signal wire pattern portion 4.

In practice, the signal wire pattern portion 4, which includes a resist portion $4_1$, and a base portion $4_2$, and the first shielding portion 6, which includes a resist portion $6_1$, and a base portion $6_2$, are folded relative to each other along the first fold line a so that pattern surfaces over which an insulation resist or a like material (such as in a base portion) is applied are brought into contact with each other. Then, the signal wire pattern portion 4 and the folded shielding portion 6 on the one hand and the second shielding portion 7, which comprises a resist portion $7_1$, and a base portion $7_2$, on the other hand are folded relative to each other along the second fold line b so that the back of the signal wire pattern portion 4 and a pattern surface of the second shielding portion 7 over which an insulation resist $7_1$ or a like material (such as in a base portion) is applied make contact with each other. In this manner, the shielded signal wire 2 is formed.

In the shielded signal wire 2, the three single flexible circuit boards, the first shielding portion 6, signal wire pattern portion 4 and second shielding portion 7 are superposed. As the section of FIG. 3 shows, a shielding pattern 12 is arranged so as to surround the signal pattern 4a for the channel A signals, the signal pattern 4c for the ground signals of the signal wire pattern portion 4. The shielded signal wire 2 thus provides a sufficient shield for the signal patterns 4a, 4b and 4c.

A high shield effect against magnetic noise leaking from the rotary head of the drum 1 is obtained by the arrangement of the signal pattern 4c for ground signals between the signal pattern 4a for the channel A signals and the signal pattern 4b for the channel B signals.

As FIG. 1 shows, the drum mounting portion 3 of the shielded signal wire 2, which has been formed by superposing the three single flexible circuit boards, is fastened to the drum upper end surface 1A of the drum 1 by screws 14A and 14B through a shielding plate 13 with a predetermined shape and is further secured to the circumferential surface 1B of the drum 1 by a screw 14C through the shielding plate 13 and the fastening pattern portion 8.

The shielded signal wire 2 is fastened to a supporting member 16 within the tape recorder by screws 14D and 14E through second and third fastening hole pattern portions 9 and 10. The three superpose single flexible circuit boards adhere to one another and form a predetermined bend 15 (FIGS. 1 and 4).

The shielded signal wire 2, which has the three single flexible circuit boards superposed and is secured in position as described above, is significantly reduced in vertical projected area as compared to a conventional shielding wire.

As shown by the solid and the dot-and-dash lines in FIG. 4, the shielded signal wire 2 deforms in accordance with the displacement of the drum 1 (indicated by the arrow d). Since the three single circuit boards are individually flexible and are not bonded to one another, the shielded signal wire 2 as a whole is not stiff and in particular is highly flexible at the bent portion 15.

The fact that the three single flexible circuit boards are superposed and adhere to one another in a bent condition to form a predetermined bent portion 15 enables the shielding effect to be effectively maintained even during displacement of the drum 1.

In the structure described above, the three single flexible circuit boards respectively provide the first shielding portion 6, the signal wire pattern portion 4 and the second shielding portion 7 and include the bent portion 15. There is thus provided a shielded signal wire 2 that has a thin and flexible structure and provides superior electrical and magnetic shielding.

Moreover, in the construction described above, the connector portion 5 is formed at the distal end of the signal wire pattern portion 4 and thereby the parts to be soldered are minimized. The shielded signal wire 2 thus simplifies the production process and remarkably enhances reliability.

The single flexible circuit boards can be punched out in a predetermined shape and then superposed, but the manufacture of the shielded signal wire 2 does not have to be performed in this way. It is essential only that three elongated flexible circuit boards be superposed to achieve the same effect as in the embodiment described above.

In the embodiment of the invention described above, the signal patterns 4a and 4b for two channels are arranged on the flexible circuit board of the signal wire pattern portion 4. However, the number of the signal patterns may be selected according to the number of the channels to be provided.

In the embodiment of the invention described above, the signal pattern 4c for ground signals is disposed between the signal patterns 4a and 4b for two channels of the signal wire pattern portion 4. Alternatively, when magnetic shielding is not necessary, the signal pattern 4c for ground signals may itself be used to form part of the shielding pattern.

In the embodiment of the invention described above, the shielding pattern 4d is arranged on both sides of the signal patterns 4a and 4b of the signal wire pattern portion 4. However, the same or practically equivalent effect can be achieved without the shielding pattern 4d if shielding needs to be effected only in certain directions or only to a certain degree.

The present invention as described above is applied to a case where head output signals are obtained from the rotary head of the tape recorder. The present invention is not limited to this case; on the contrary, the invention may be suitably applied to various shielded signal wires for drawing out output signals from optical pickups of an optical disk drive, various sensors or the like.

While the invention has been described with reference to its preferred embodiments, it will be understood by those skilled in the art that various changes and modifications may be made in those embodiments without departing from the invention. It is intended, therefore, to cover in the appended claims all such changes and modifications as fall within the spirit and scope of the invention.

What is claimed is:

1. A shielded signal wire in the form of a flexible printed board, said flexible printed board comprising:
   first and second shielding portions in the shape of a strip and having a predetermined shield pattern;
   first and second spaced-apart connector portions; and
   a signal line pattern portion in the shape of a strip and having a conductive pattern that forms a predetermined signal line connecting said first and second connector portions;
   said first and second shielding portions and said signal line pattern portion being connected together and said first and second shielding portions being respectively folded about first and second fold lines so that said first shielding portion overlies said signal line pattern portion to one side thereof and said second shielding portion overlies said signal line pattern portion on another side thereof.

2. A shielded signal wire according to claim 1 in which said conductive pattern of said signal line pattern portion is formed at a first location on a given surface of said flexible printed board and said shield patterns of said first and second shielding portions are respectively formed at second and third locations on said given surface, said first, second and third locations being spaced apart from one another before folding of said first and second shielding portions.

3. A shielded signal wire according to claim 1 in which said signal line pattern portion has shielding patterns at at least one end of said conductive pattern on the same surface as the surface on which said conductive pattern is formed.

4. A shielded signal wire according to claim 1 in which said conductive pattern of said signal line pattern portion has first, second and third conductive patterns formed in parallel with one another, said second conductive pattern being between said first and third conductive patterns and used as a ground line.

5. In combination, a shielded signal wire according to claim 1 and a movable rotary head drum, an electronic circuit and a printed board mounting said electronic circuit, said first connector portion being connected to said rotary head drum and said second connector portion being connected to said printed board, and said electronic circuit providing a recording signal to or receiving a reproduced signal from said rotary head drum.

6. A shielded signal wire according to claim 1 in which said first and second shielding portions are in parallel with each other and are folded about a pair of fold lines that respectively extend in different directions.

7. A method of manufacturing a shielded signal wire comprising the steps of:
   forming a substantially flat flexible circuit board having a substantially flat signal wire portion on which signal wires are provided and first and second substantially flat shielding portions;
   folding the first shielding portion over one side of the signal wire portion; and
   folding the second shielding portion over an opposite side of the signal wire portion;
   thereby substantially enclosing the signal wire portion within the first and second shielding portions.

8. A method according to claim 7 wherein the first shielding portion is folded about a first fold line and the second shielding portion is folded about a second fold line, the first and second fold lines being perpendicular to each other.

* * * * *